United States Patent
He et al.

(10) Patent No.: US 9,634,000 B2
(45) Date of Patent: Apr. 25, 2017

(54) PARTIALLY ISOLATED FIN-SHAPED FIELD EFFECT TRANSISTORS

(71) Applicant: International Business Machines Corporation, Armonk, NY (US)

(72) Inventors: Hong He, Schenectady, NY (US); Chiahsun Tseng, Wynantskill, NY (US); Chun-chen Yeh, Clifton Park, NY (US); Yunpeng Yin, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/831,172

(22) Filed: Mar. 14, 2013

(65) Prior Publication Data

US 2014/0264596 A1 Sep. 18, 2014

(51) Int. Cl.
| | |
|---|---|
| H01L 27/088 | (2006.01) |
| H01L 21/84 | (2006.01) |
| H01L 21/8234 | (2006.01) |
| H01L 29/66 | (2006.01) |
| H01L 27/12 | (2006.01) |

(52) U.S. Cl.
CPC .. *H01L 27/0886* (2013.01); *H01L 21/823431* (2013.01); *H01L 21/845* (2013.01); *H01L 27/1211* (2013.01); *H01L 29/66477* (2013.01); *H01L 29/66545* (2013.01)

(58) Field of Classification Search
CPC ......... H01L 27/0886; H01L 21/823431; H01L 21/845

USPC ......................................................... 257/347
See application file for complete search history.

(56) References Cited

U.S. PATENT DOCUMENTS

| | | | | |
|---|---|---|---|---|
| 7,074,662 | B2 * | 7/2006 | Lee et al. | 438/199 |
| 7,564,105 | B2 | 7/2009 | Chi et al. | 257/401 |
| 7,615,429 | B2 * | 11/2009 | Kim et al. | 438/197 |
| 7,683,428 | B2 | 3/2010 | Chidambarrao et al. | 257/347 |
| 7,910,482 | B2 | 3/2011 | Stephens et al. | 438/689 |
| 8,043,920 | B2 * | 10/2011 | Chan et al. | 438/300 |
| 8,138,030 | B2 | 3/2012 | Chang et al. | 438/151 |
| 8,564,064 | B2 | 10/2013 | Cheng et al. | 257/351 |
| 8,614,127 | B1 * | 12/2013 | Yang et al. | 438/270 |
| 8,624,320 | B2 * | 1/2014 | Schultz | 257/354 |
| 8,703,556 | B2 * | 4/2014 | Kelly | H01L 29/66795 257/296 |
| 8,716,091 | B2 * | 5/2014 | Cohen et al. | 438/300 |
| 8,716,156 | B1 * | 5/2014 | Pawlak | H01L 21/82382 438/770 |

(Continued)

*Primary Examiner* — Jarrett Stark
*Assistant Examiner* — Charles N Ausar-El
(74) *Attorney, Agent, or Firm* — Ido Tuchman; Vazken Alexanian

(57) ABSTRACT

A transistor device and a method for forming a fin-shaped field effect transistor (FinFET) device, with the channel portion of the fins on buried silicon oxide, while the source and drain portions of the fins on silicon. An example method includes receiving a wafer with a silicon layer electrically isolated from a silicon substrate by a buried oxide (BOX) layer. The BOX layer is in physical contact with the silicon layer and the silicon substrate. The method further comprises implanting a well in the silicon substrate and forming vertical sources and drains over the well between dummy gates. The vertical sources and drains extend through the BOX layer, fins, and a portion of the dummy gates.

21 Claims, 7 Drawing Sheets

(56) References Cited

U.S. PATENT DOCUMENTS

| | | | |
|---|---|---|---|
| 8,815,659 B2 | 8/2014 | Chi et al. | 438/157 |
| 2004/0256639 A1 | 12/2004 | Ouyang et al. | 257/202 |
| 2005/0020020 A1* | 1/2005 | Collaert et al. | 438/300 |
| 2005/0035415 A1 | 2/2005 | Yeo et al. | 257/401 |
| 2005/0202618 A1 | 9/2005 | Yagishita | 438/197 |
| 2006/0022262 A1* | 2/2006 | Yoon et al. | 257/328 |
| 2006/0088967 A1* | 4/2006 | Hsiao et al. | 438/296 |
| 2006/0202239 A1* | 9/2006 | Holmes | H01L 29/66545 |
| | | | 257/288 |
| 2008/0035997 A1 | 2/2008 | Hofmann et al. | 257/347 |
| 2010/0038679 A1 | 2/2010 | Chan et al. | 257/190 |
| 2011/0031552 A1 | 2/2011 | Iwamatsu et al. | 257/347 |
| 2011/0045648 A1* | 2/2011 | Knorr | H01L 21/76232 |
| | | | 438/296 |
| 2011/0068414 A1* | 3/2011 | Anderson et al. | 257/401 |
| 2011/0095378 A1 | 4/2011 | Lee et al. | 257/401 |
| 2011/0111596 A1* | 5/2011 | Kanakasabapathy | H01L 21/0337 |
| | | | 438/694 |
| 2011/0241073 A1* | 10/2011 | Cohen et al. | 257/192 |
| 2011/0298058 A1 | 12/2011 | Kawasaki et al. | 257/401 |
| 2011/0298061 A1* | 12/2011 | Siddiqui | H01L 21/28088 |
| | | | 257/410 |
| 2012/0007051 A1* | 1/2012 | Bangsaruntip | B82Y 10/00 |
| | | | 257/24 |
| 2012/0043610 A1 | 2/2012 | Cheng et al. | 257/347 |
| 2012/0068264 A1 | 3/2012 | Cheng et al. | 257/347 |
| 2012/0091528 A1* | 4/2012 | Chang et al. | 257/347 |
| 2012/0104498 A1* | 5/2012 | Majumdar et al. | 257/351 |
| 2012/0205742 A1* | 8/2012 | Iyer et al. | 257/347 |
| 2012/0306000 A1 | 12/2012 | Chang et al. | 257/324 |
| 2012/0309139 A1 | 12/2012 | Liang et al. | 438/158 |
| 2013/0045576 A1* | 2/2013 | Tsai et al. | 438/151 |
| 2013/0062695 A1* | 3/2013 | Hong | 257/347 |
| 2013/0154005 A1 | 6/2013 | Basker et al. | 257/347 |
| 2013/0154006 A1 | 6/2013 | Basker et al. | 257/347 |
| 2013/0164890 A1 | 6/2013 | Basker et al. | 438/151 |
| 2013/0175584 A1* | 7/2013 | Ho et al. | 257/288 |
| 2013/0175620 A1 | 7/2013 | Cai et al. | 257/347 |
| 2013/0175624 A1 | 7/2013 | Chang et al. | 257/347 |
| 2013/0193526 A1* | 8/2013 | Lo et al. | 257/401 |
| 2013/0309856 A1 | 11/2013 | Jagannathan et al. | 438/587 |
| 2013/0334606 A1* | 12/2013 | Shen et al. | 257/368 |
| 2013/0334610 A1* | 12/2013 | Moroz et al. | 257/369 |
| 2014/0015055 A1* | 1/2014 | Flachowsky et al. | 257/368 |
| 2014/0065782 A1* | 3/2014 | Lu et al. | 438/294 |
| 2014/0110784 A1* | 4/2014 | Jagannathan et al. | 257/347 |
| 2014/0273363 A1* | 9/2014 | Chiu | H01L 21/3086 |
| | | | 438/165 |

* cited by examiner

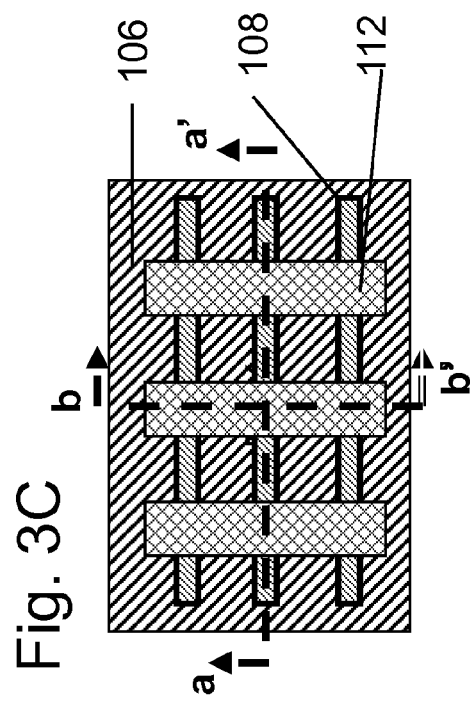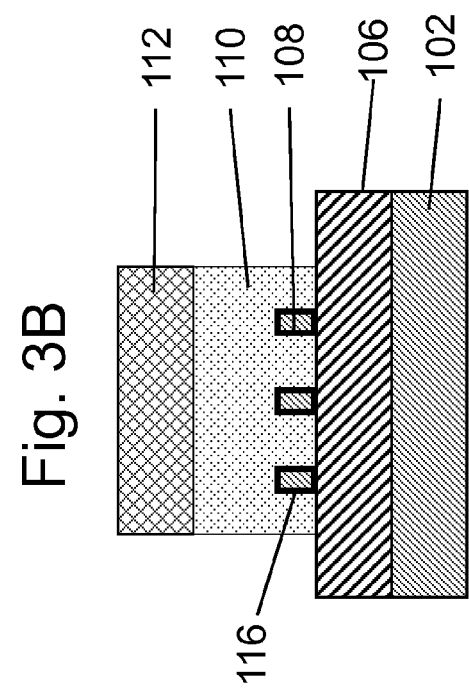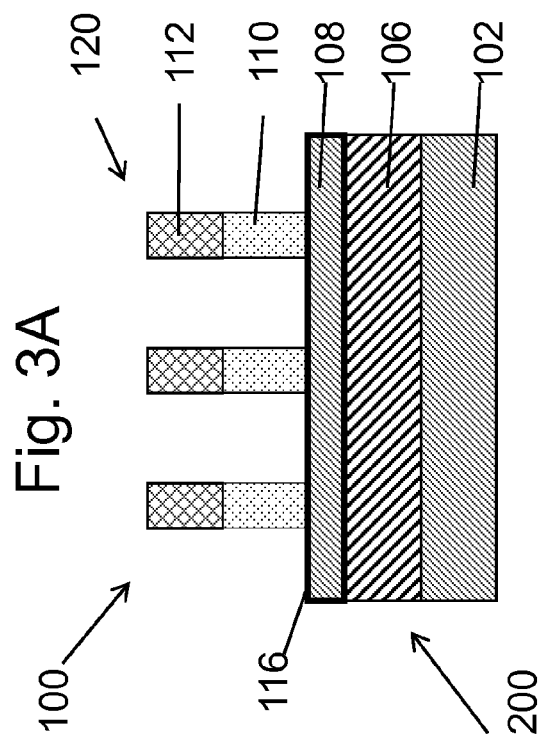

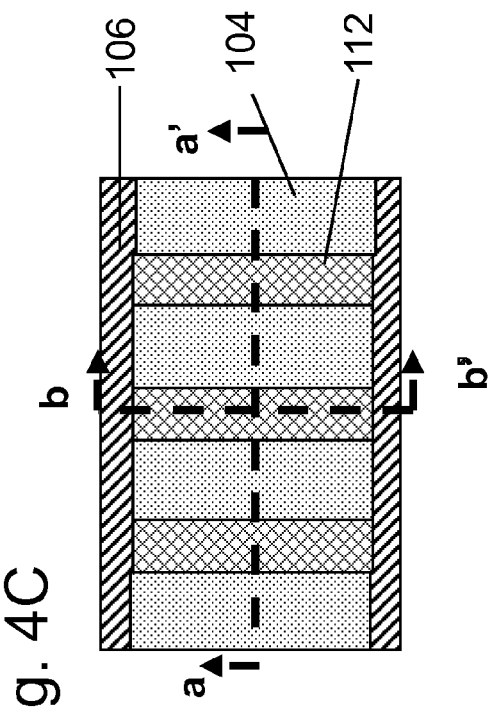
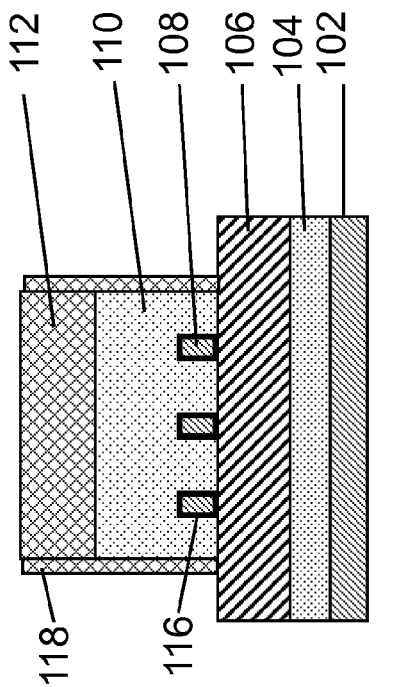
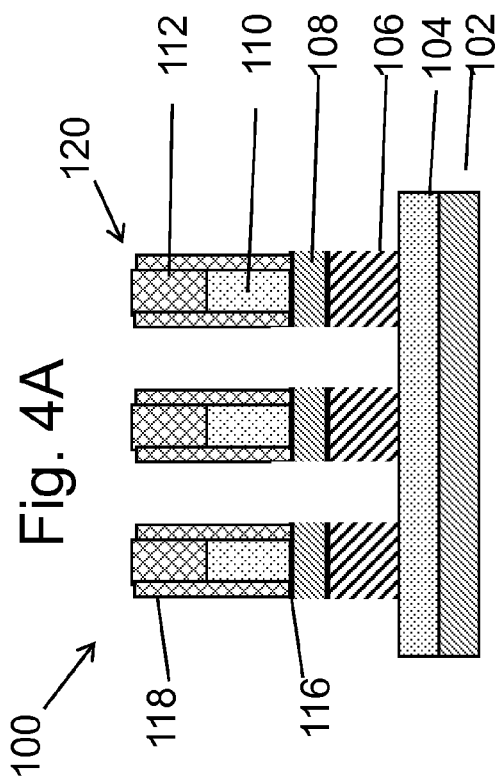

0
PARTIALLY ISOLATED FIN-SHAPED FIELD EFFECT TRANSISTORS

BACKGROUND

This invention relates to transistors, and more particularly to partially isolated fin-shaped field effect transistors (Fin-FET) and methods for their construction. In particular, the channel portion of the fins is on buried silicon oxide, while the source and/or drain portions of the fins land on silicon.

For 14 nm node, FinFET technology is considered as one of the front-up options. In a conventional FinFET integration process, the fins are typically first patterned, and followed with gate patterning and spacer etching. However, fin erosion is a key concern in the gate and spacer etching processes. While increasing the thickness of fin hard mask is helpful to minimize the fin erosion, it is not friendly for trigate channel FinFET integration. In addition, Fin epitaxial merge is challenging from epitaxial thin film growth point of view. The epitaxial silicon might be formed between fin gaps but with some fins not epitaxially merged while others are. This can impact the finFET device performance significantly. Moreover, if the fin epitaxial process is not well controlled, it may cause source and drain short problem at the gate line ends.

BRIEF SUMMARY

Accordingly, one exemplary aspect of the present invention is a method for forming a fin-shaped field effect transistor (FinFET) device, in particular, with the channel portion of the fins on buried silicon oxide, while the source or drain portion of the fins on silicon. The method comprises receiving a wafer that includes a silicon layer electrically isolated from a silicon substrate by a buried oxide (BOX) layer. The BOX layer is in physical contact with the silicon layer and the silicon substrate. The method further comprises implanting a well in the silicon substrate and forming vertical sources and drains over the well between dummy gates. The vertical sources and drains extend through the BOX layer, fins, and a portion of the dummy gates.

Another exemplary of the present invention is a fin-shaped field effect transistor (FinFET) device, with fins in the channel region on buried silicon oxide while fins in the source or drain region landing on silicon substrate. The device comprises a wafer that includes a silicon substrate and a buried oxide (BOX) layer. The BOX layer is in physical contact with the silicon substrate. The device further comprises a well in the silicon substrate and vertical sources and drains over the well between dummy gates. The vertical sources and drains extend through the BOX layer, fins, and a portion of the dummy gates.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 1C shows a top view of the exemplary FinFET device. FIG. 1A shows the exemplary FinFET device along cross-sectional line a-a'. FIG. 1B shows the exemplary FinFET device along cross-sectional line b-b'.

FIGS. 3A-3C show an exemplary intermediate step in constructing the FinFET device in accordance with one embodiment of the present invention. FIG. 3C shows a top view of the exemplary intermediate step of FinFET device. FIG. 3A shows the exemplary intermediate step of FinFET device along cross-sectional line a-a'. FIG. 3B shows the exemplary intermediate step of FinFET device along cross-sectional line b-b'.

FIGS. 4A-4C show another exemplary intermediate step in constructing the FinFET device in accordance with one embodiment of the present invention. FIG. 4C shows a top view of another exemplary intermediate step of FinFET device. FIG. 4A shows another exemplary intermediate step of FinFET device along cross-sectional line a-a'. FIG. 4B shows another exemplary intermediate step of FinFET device along cross-sectional line b-b'.

DETAILED DESCRIPTION

Figure 1C:
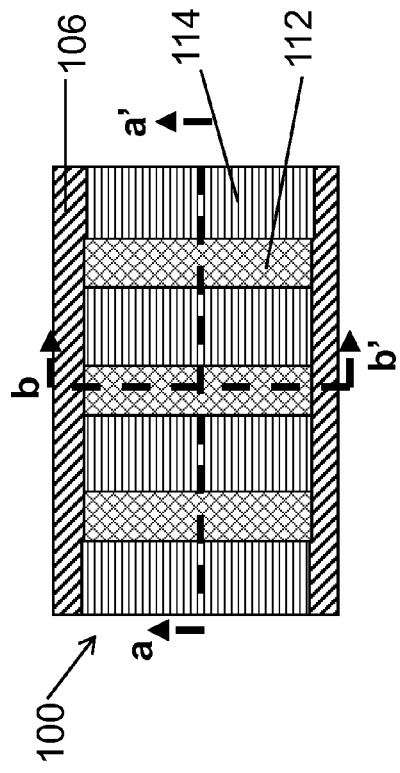
FIGS. 1A-1C show an exemplary fin-shaped field effect transistor (FinFET) device contemplated by the present invention.

The present invention is described with reference to embodiments of the invention. Throughout the description of the invention reference is made to FIGS. 1A-5C. When referring to the figures, like structures and elements shown throughout are indicated with like reference numerals.

Figure 1B:
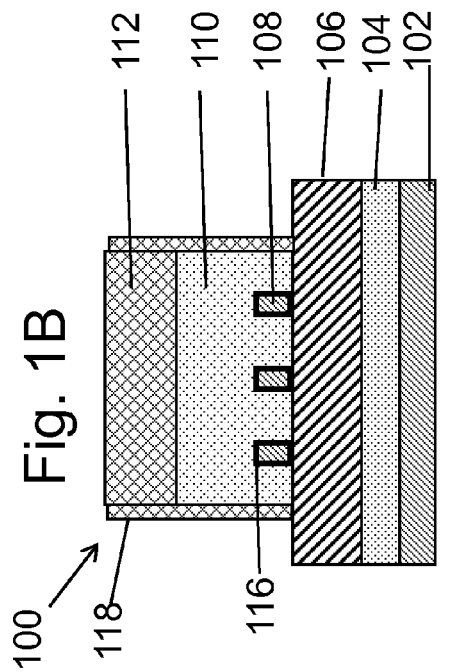
Figure 1A:
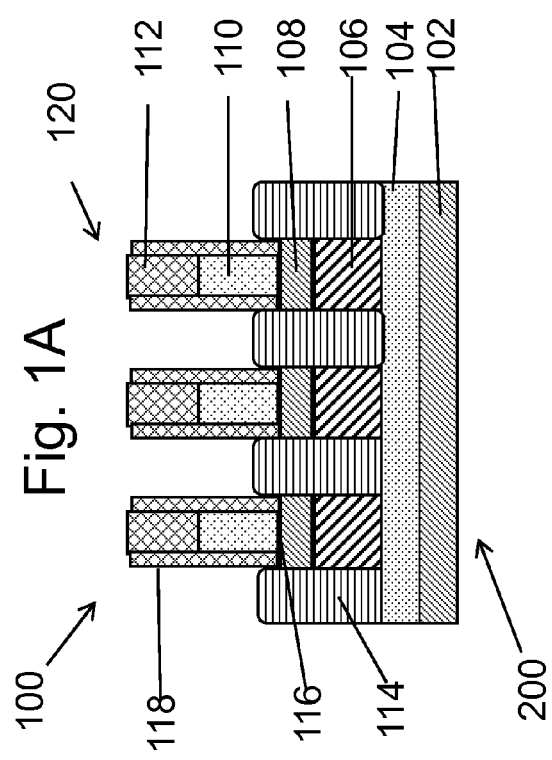

FIGS. 1A-1C show an exemplary fin-shaped field effect transistor (FinFET) device 100 contemplated by the present invention. FIG. 1C shows a top view of the exemplary FinFET device 100. FIG. 1A shows the exemplary FinFET device 100 along cross-sectional line a-a'. FIG. 1B shows the exemplary FinFET device 100 along cross-sectional line b-b'.

As shown in FIGS. 1A-1C, the FinFET device 100 includes a silicon substrate 102 and a well 104 in the silicon substrate 102. Vertical sources and drains 114 are formed over the well 104 between dummy gates 120. The vertical sources and drains 114 extend through a buried oxide (BOX) layer 106, fins 108, and a small portion of the dummy gates 120. In addition, an oxide layer 116 is formed along the top and sides of the fins 108, and a spacer layer 118 is formed along the top and sides of the dummy gates 120. In one embodiment, the well 104 may comprise a P+ well (for nFET), and the vertical sources and drains 114 may comprise n-doped epitaxial silicon. In another embodiment, the well 104 may comprise a N+ well (for pFET), and the vertical sources and drains 114 may comprise p-doped epitaxial silicon. In another embodiment, the top surface of the silicon substrate 102 between the dummy gates may be with <100> crystal orientation.

Figure 2:
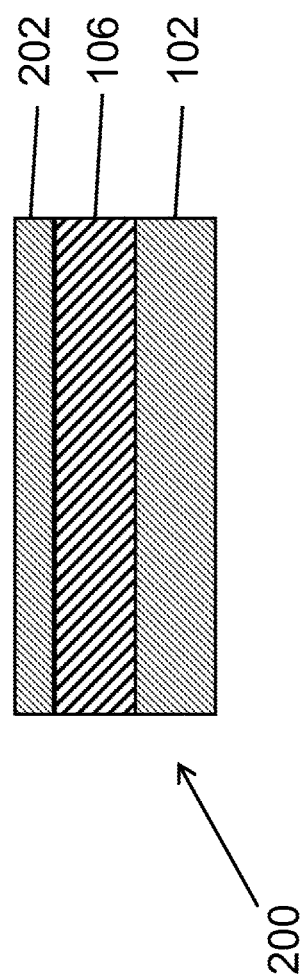
FIG. 2 shows an exemplary wafer received at the beginning of constructing the FinFET device in accordance with one embodiment of the present invention.

FIG. 2 shows an exemplary wafer 200 received at the beginning of constructing the FinFET device 100 in accordance with one embodiment of the present invention. The wafer 200 includes a silicon layer 202 electrically isolated from the silicon substrate 102 by the BOX layer 106. The BOX layer 106 is in physical contact with the silicon layer 202 and the silicon substrate 102. In one embodiment, the BOX layer 106 may comprise silicon oxide.

FIGS. 3A-3C show an exemplary intermediate step in constructing the FinFET device 100 in accordance with one embodiment of the present invention. FIG. 3C shows a top view of the exemplary intermediate step of FinFET device 100. FIG. 3A shows the exemplary intermediate step of FinFET device 100 along cross-sectional line a-a'. FIG. 3B shows the exemplary intermediate step of FinFET device 100 along cross-sectional line b-b'.

As shown in FIGS. 3A-3C, both the fins 108 and the dummy gates 120 are formed over the BOX layer 106, with the length of the fins 108 and the length of the dummy gates 120 perpendicular to each other. The dummy gates 120 may comprise a layer of hard mask 112 stacked over a layer of silicon material 110. In addition, an oxide layer 116 is formed along the top and sides of the fins 108. In one embodiment, the fins 108 have a pitch of 20 nm to 100 nm, a critical dimension of 6 nm to 30 nm, and a height of 15 nm to 50 nm. In another embodiment, the fins have a pitch of 40 nm, a critical dimension of 10 nm, and a height of 25 nm. The layer of silicon material 110 may comprise amorphous silicon or polycrystalline silicon. In one embodiment, the layer of hard mask 112 may comprise a layer of silicon nitride. In another embodiment, the layer of hard mask 112 may comprise a layer of silicon oxide over a layer of silicon nitride. In one embodiment, the oxide layer 116 may comprise silicon oxide with a thickness of 2 nm to 5 nm.

FIGS. 4A-4C show another exemplary intermediate step in constructing the FinFET device 100 in accordance with one embodiment of the present invention. FIG. 4C shows a top view of another exemplary intermediate step of FinFET device 100. FIG. 4A shows another exemplary intermediate step of FinFET device 100 along cross-sectional line a-a'. FIG. 4B shows another exemplary intermediate step of FinFET device 100 along cross-sectional line b-b'.

As shown in FIGS. 4A-4C, a spacer layer 118 is formed along the top and sides of the dummy gates 120. A well 104 is implanted in the silicon substrate 102. In addition, vertical trenches 402 are formed over the well 104 between the dummy gates 120. The vertical trenches 402 extend through the fins 108 and the BOX layer 106. The well 104 may comprise a P+ well or an N+ well. In one embodiment, the top surface of the well 104 between the dummy gates 120 may be with <100> crystal orientation. In another embodiment, the spacer layer 118 may comprise silicon nitride.

Figure 5A:
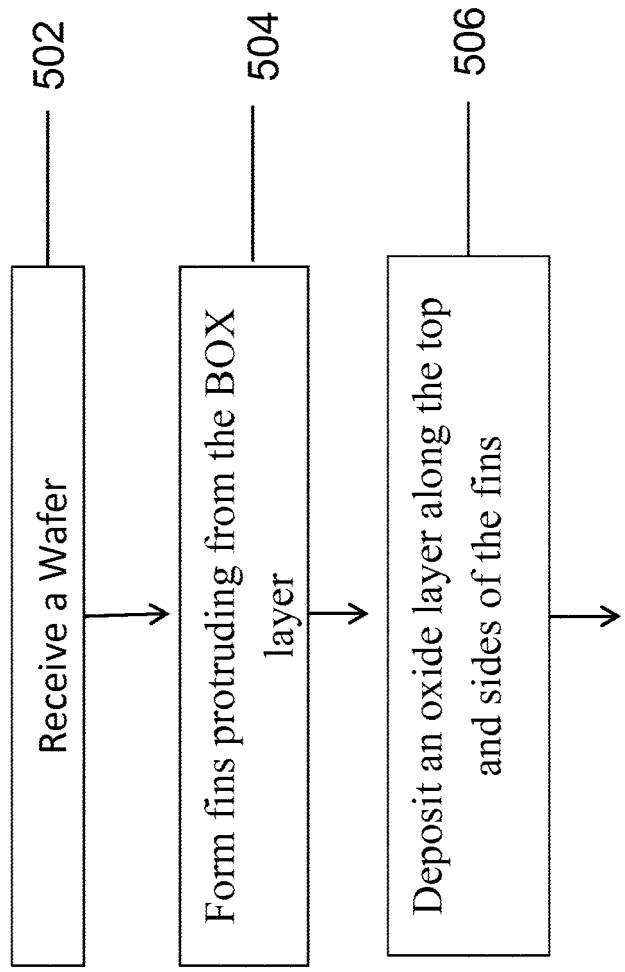
FIGS. 5A-5C show a method for fabricating a FinFET device in accordance with one embodiment of the present invention.
Figure 5B:
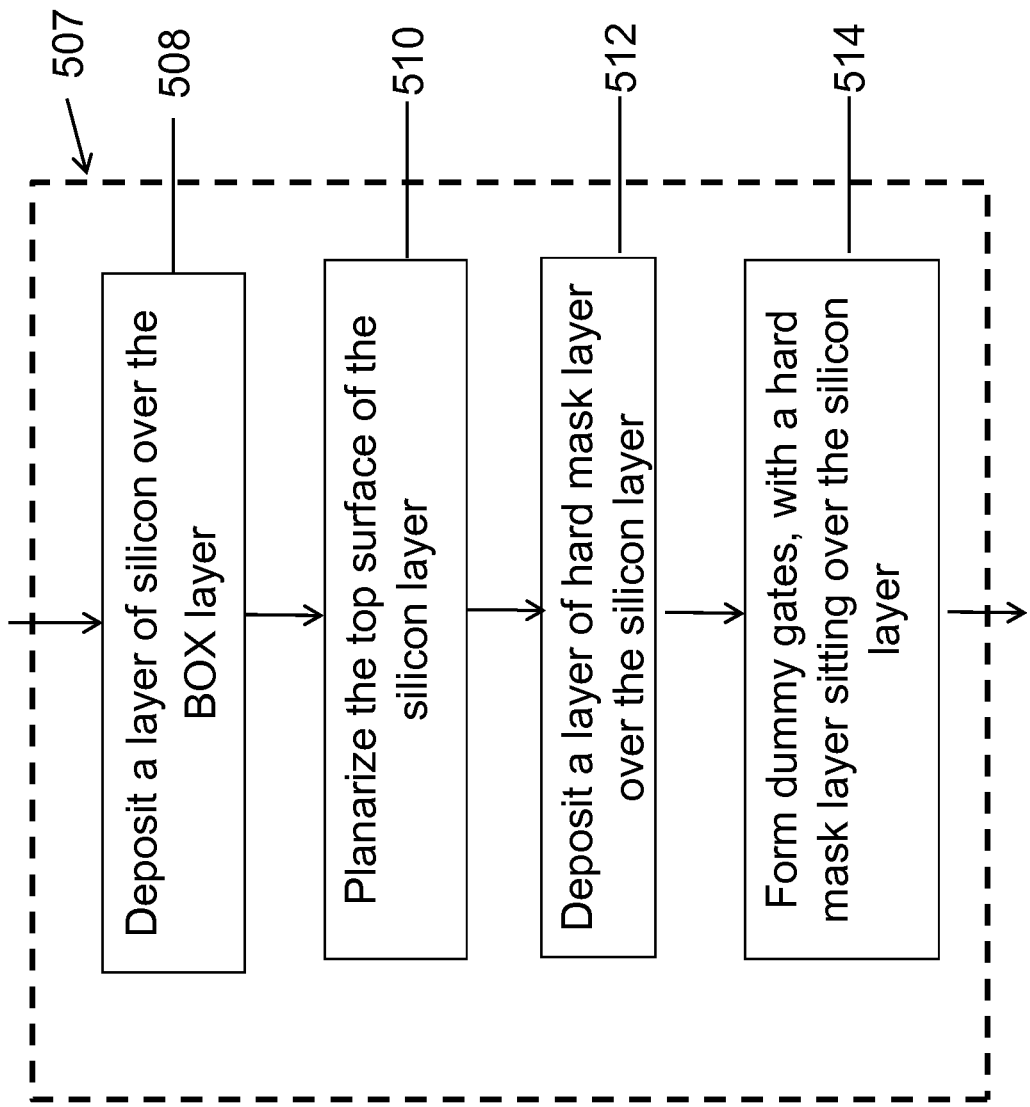
Figure 5C:
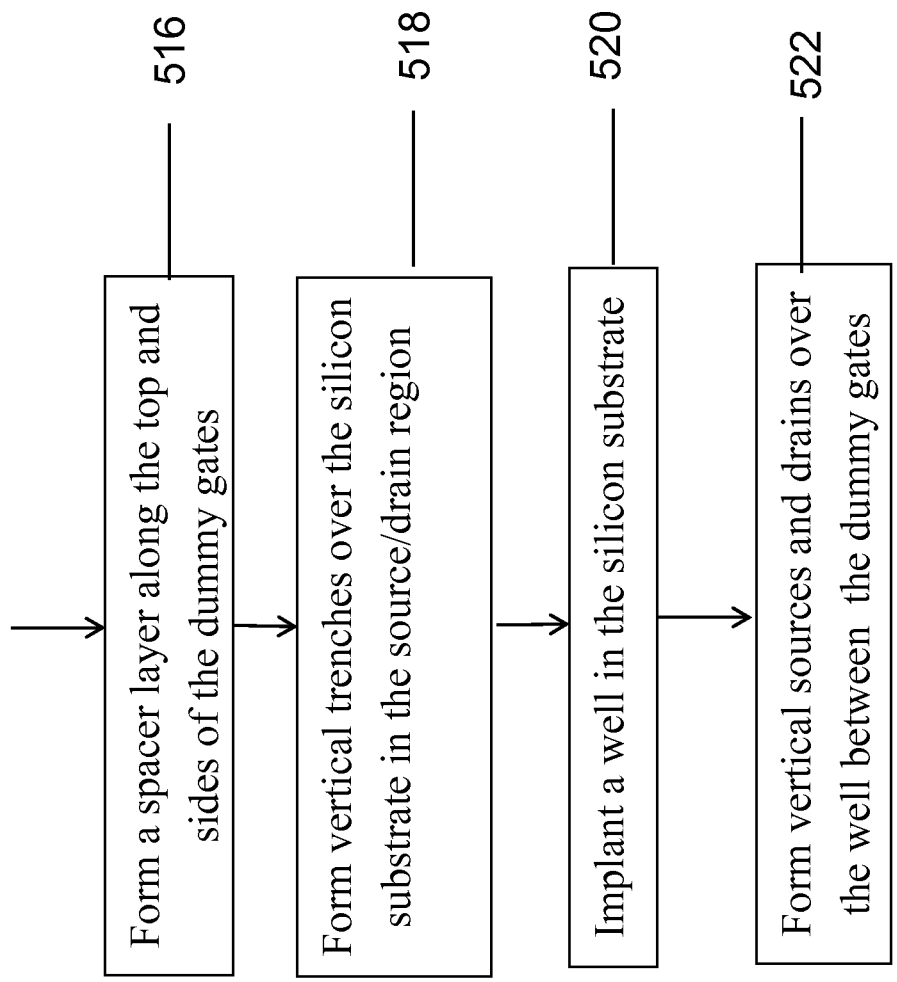

FIGS. 5A-5C show a method for fabricating a FinFET device 100 in accordance with one embodiment of the present invention. The fabrication method includes a receiving step 502. During the receiving step 502, a wafer 200 is received. The wafer includes a silicon layer 202 electrically isolated from a silicon substrate 102 by a buried oxide (BOX) layer 106. The BOX layer 106 is in physical contact with the silicon layer 202 and the silicon substrate 102. After the receiving step 502 is completed, the method continues to forming fins step 504.

At forming fins step 504, fins 108 are formed over the BOX layer 106 through an advanced lithographical method. In one embodiment, the fins 108 are formed through a sidewall image transfer technique. During this step, mandrels are first formed lithographically. A conformal spacer is then deposited around the mandrels. Finally, fins 108 with tight pitches are formed by etching away the conformal spacer on top of mandrel and pulling away the mandrel.

In one embodiment, the fins 108 have a pitch of 20 nm to 100 nm, a critical dimension of 6 nm to 30 nm, and a height of 15 nm to 50 nm. In another embodiment, the fins 108 have a pitch of 40 nm, a critical dimension of 10 nm, and a height of 25 nm. After forming fins step 504 is completed, the method continues to a depositing step 506.

At the depositing step 506, a conformal oxide layer 116 is deposited along the top and sides of the fins 108. In one embodiment, the oxide layer 116 may comprise silicon oxide with a thickness of 2 nm to 5 nm. After the depositing step 506 is completed, the method continues to forming step 507.

At forming step 507, dummy gates 120 are formed over the BOX layer 106, with the length of the dummy gates 120 perpendicular to the length of the fins 108. In one embodiment, forming step 507 includes depositing step 508. At depositing step 508, a layer of silicon 110 is formed over the BOX layer. In one embodiment of depositing step 508, a layer of amorphous silicon material is deposited over the BOX layer 106 through a chemical vapor deposition method. In another embodiment of depositing step 508, the wafer 200 is further annealed at a temperature between 600° C. and 950° C. to convert the amorphous silicon to polycrystalline silicon. After depositing step 508 is completed, the forming step 507 continues to planarizing step 510.

At planarizing step 510, the top surface of the silicon layer 110 is planarized by a chemical-mechanical planarization method. After planarizing step 510 is completed, forming step 507 continues to depositing step 512.

At depositing step 512, a hard mask (HM) layer 112 is deposited over the silicon layer 110. The hard mask 112 can be a single layer or a bilayer. In one embodiment, the hard mask 112 may comprise a layer of silicon nitride. In another embodiment, the hard mask 112 may comprise a layer of silicon oxide over a layer of silicon nitride. In one embodiment, the bilayer hardmask consists of 20-100 nm SiO2 on top of 20-100 nm SiN. After depositing step 512 is completed, forming step 507 continues to forming dummy gates step 514.

At forming dummy gates step 514, the dummy gates 120 are formed through an advanced lithography method, with a hard mask layer 112 sitting over the silicon layer 110. In one embodiment of forming dummy gates step 514, for beyond 22 nm nodes, the dummy gates 120 are formed through pitch splitting or sidewall image transfer techniques. In another embodiment of forming dummy gates step 514, a cut mask or a third mask is introduced in order to cut away redundant dummy gates 120 and form dummy gates 120 at various gate lengths and pitches. After forming dummy gates step 514 is completed, the method continues to forming a spacer step 516.

At forming a spacer step 516, a conformal spacer layer 118 is formed along the top and sides of the dummy gates 120 and fins 108. In one embodiment, a conformal spacer layer 118 is first deposited along the top and the sides of the dummy gates 120 and the exposed fins 108 top and sidewalls. Next, a plasma etch is performed to remove the spacer layer 118 from the top and sides of the fins 108 and to keep the spacer layer 118 along the sides of the dummy gates 120 intact. The spacer layer 118 may comprise silicon nitride that is deposited conformally at 500-700° C., then annealed at over 1000° C. In another embodiment, the spacer etch is performed separately at nFET and pFET regions, and hence a series block masks are used to cover nFET and pFET during processing, respectively. After forming a spacer step 516 is completed, the method continues to forming vertical trenches step 518.

At forming vertical trenches step 518, vertical trenches 402 are formed over the silicon substrate 102 between the dummy gates 120. The vertical trenches 402 extend through the fins 108 and the BOX layer 106. In one embodiment, the exposed fins 108 and the Box layer 106 between the dummy gates 120 are removed by a plasma etching technique. In another embodiment, a <100> crystal orientation is formed on the exposed top surface of the silicon substrate 102 between the dummy gates 120. After forming vertical trenches step 518 is completed, the method continues to implanting a well step 520.

At implanting a well step 520, a well 104 is implanted in the silicon substrate 102. In one embodiment, the well 104 may comprise a P+ well for nFET. In another embodiment, the well 104 may comprise an N+ well for pFET. After implanting a well step 520 is completed, the method continues to forming vertical sources and drains step 522.

At forming vertical sources and drains step 522, vertical sources and drains 114 are formed over the well 104 between the dummy gates 120. The vertical sources and drains 114 extend through the BOX layer 106, the fins 108, and a small portion of the dummy gates 120. In one embodiment, if the well 104 comprises a P+ well, n-doped epitaxial silicon is grown inside the vertical trenches 402 to the level slightly higher than the top surface of the fins 108. In another embodiment, if the well 104 comprises a N+ well, p-doped epitaxial silicon is grown inside the vertical trenches 402 to the level slightly higher than the top surface of the fins 108.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for forming a fin-shaped field effect transistor (FinFET) device, with the channel portion of the fins on buried silicon oxide, with source and drain portions of fins on silicon, the method comprising:
    receiving a wafer, the wafer including a silicon layer electrically isolated from a silicon substrate by a buried oxide (BOX) layer, the BOX layer being in physical contact with the silicon layer and the silicon substrate;
    forming the fins protruding from the BOX layer stacked along a horizontal direction such that each of the fins is in contact with the BOX layer by forming mandrels, depositing a conformal mandrel spacer around the mandrels, and etching away the conformal mandrel spacer on top of the mandrel, the fins having a fin length;
    implanting a well in the silicon substrate, the well including a top surface;
    forming dummy gates over and in contact with the BOX layer, the dummy gates having a dummy gate length that is perpendicular to the fin length; and
    forming vertical sources and drains over the well between the dummy gates, the vertical sources and drains extending through the BOX layer, fins, and a portion of the dummy gates, the vertical sources and drains physically contacting the top surface of the well.

2. The method of claim 1, further comprising:
    depositing an oxide layer along the top and sides of the fins;
    forming a spacer layer along the top and sides of the dummy gates; and
    forming vertical trenches over the silicon substrate between the dummy gates, the vertical trenches extending through the fins and the BOX layer.

3. The method of claim 2, wherein implanting the well is performed after forming the vertical trenches.

4. The method of claim 3, wherein the BOX layer comprises silicon oxide.

5. The method of claim 3, wherein the fins have a pitch of 20-100 nm, a critical dimension of 6 nm to 30 nm, and a height of 15 nm to 50 nm.

6. The method of claim 3, wherein the oxide layer comprises silicon oxide.

7. The method of claim 3, wherein the dummy gates comprise a layer of hard mask stacked over a layer of silicon material.

8. The method of claim 7, wherein the layer of hard mask comprises silicon nitride.

9. The method of claim 8, wherein the layer of hard mask comprises a layer of silicon oxide over a layer of silicon nitride.

10. The method of claim 8, wherein the layer of silicon material comprises amorphous silicon or polycrystalline silicon.

11. The method of claim 3, wherein the spacer layer comprises silicon nitride.

12. The method of claim 3, wherein forming vertical trenches comprises etching away the exposed fins and then the exposed BOX layer between the dummy gates.

13. The method of claim 12, wherein etching away the exposed fins and then the exposed BOX layer comprises performing a plasma etching.

14. The method of claim 13, wherein forming vertical trenches further comprises forming <100> crystal orientation on the exposed top surface of the silicon substrate between the dummy gates.

15. The method of claim 3, wherein implanting a well comprises implanting a P+ well.

16. The method of claim 15, wherein forming vertical sources and drains comprises growing n-doped epitaxial silicon inside the vertical trenches to the level slightly higher than the top surface of the fins.

17. The method of claim 3, wherein implanting a well comprises implanting a N+ well.

18. The method of claim 17, wherein forming vertical sources and drains comprises growing p-doped epitaxial silicon inside the vertical trenches to the level slightly higher than the top surface of the fins.

19. The method of claim 1, wherein forming the vertical sources and drains over the well between the dummy gates includes forming the vertical sources and drains entirely above the well between the dummy gates.

20. The method of claim 1, further comprising depositing a conformal spacer layer along the top and the sides of the dummy gates and fins.

21. The method of claim 1, further comprising depositing a conformal oxide layer along and in contact with tops and sides of all the fins.

* * * * *